(12) United States Patent
Wu

(10) Patent No.: US 6,650,048 B2
(45) Date of Patent: Nov. 18, 2003

(54) VENTILATED LIGHT EMITTING DIODE MATRIX PANEL

(76) Inventor: Jiahn-Chang Wu, 15, Lane 13, Alley 439, Her-Chiang Street, Chu-Tung, Hsinchu (TW)

( * ) Notice: Subject to any disclaimer, the term of this patent is extended or adjusted under 35 U.S.C. 154(b) by 113 days.

(21) Appl. No.: 09/982,371

(22) Filed: Oct. 19, 2001

(65) Prior Publication Data

US 2003/0076033 A1 Apr. 24, 2003

(51) Int. Cl.[7] .................................................. H01S 3/14
(52) U.S. Cl. ........................................ 313/512; 313/505
(58) Field of Search ................................ 313/512, 500, 313/505; 372/35, 50; 362/373, 294, 600; 257/49, 712, 721

(56) References Cited

U.S. PATENT DOCUMENTS 5,105,430 A * 4/1992 Mundinger et al. ........... 372/35
5,785,418 A * 7/1998 Hochstein ................... 362/373

\* cited by examiner

*Primary Examiner*—Ashok Patel
*Assistant Examiner*—Ken A Berck
(74) *Attorney, Agent, or Firm*—H. C. Lin

(57) ABSTRACT

LEDs of a light matrix display are mounted between two metal frames. Each frame has air ducts to circulate air around the LEDs, thereby removing the heat generated in the LEDs and allowing higher intensity light to be emitted.

15 Claims, 18 Drawing Sheets

VENTILATED LIGHT EMITTING DIODE MATRIX PANEL

BACKGROUND OF THE INVENTION (1) Field of the Invention

This invention relates to light emitting diodes (LED), particularly to LED panels.

(2) Brief Description of Related Art

FIG. 1 shows a prior art LED matrix panel. Each LED is mounted on an insulating substrate 13 with bottom electrode bonded by connection 11 and the top electrode wire-bonded to connection 12 as shown in the side view FIG. 2. The shortcoming of this kind of matrix panel is that there is no provision for heat removal. Such a structure is not suitable for high intensity display, which may cause overheating.

SUMMARY OF THE INVENTION

An object of this invention is to provide ventilation for the LED matrix to prevent overheating. Another object of this invention is provide multi-color LED matrix display.

These objects are achieved by provide air ventilation through each LED. There are two metal frames spaced from each other. Each LED is mounted on one of the two metal frames. Each metal frame has air ducts, which surround the LEDs. The air ducts surround the LEDs to ventilate the LEDs

BRIEF DESCRIPTION OF THE SEVERAL VIEWS OF DRAWINGS

DETAILED DESCRIPTION OF THE INVENTION

Figure 1:
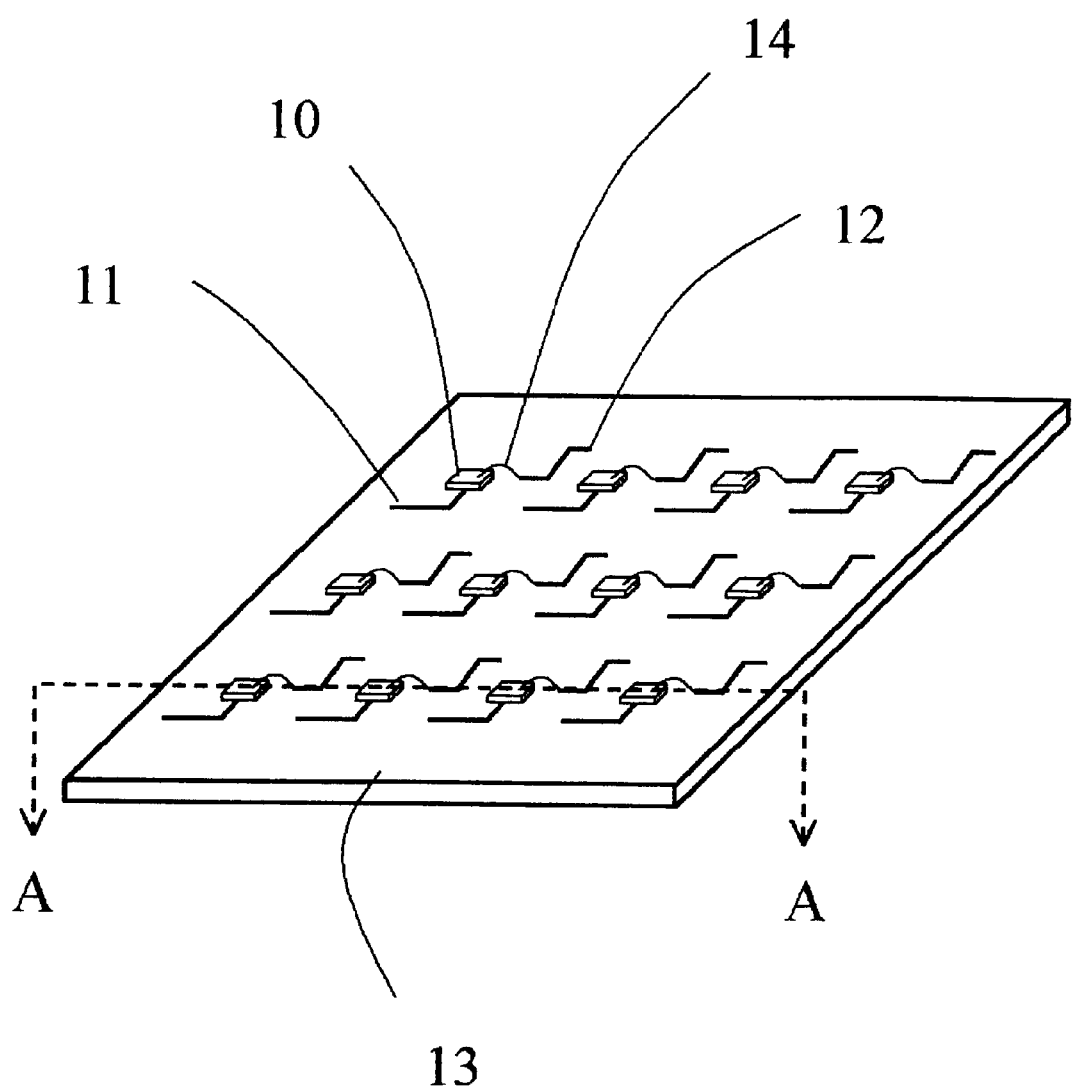
FIG. 1 shows the top view of a prior art LED matrix.
Figure 2:
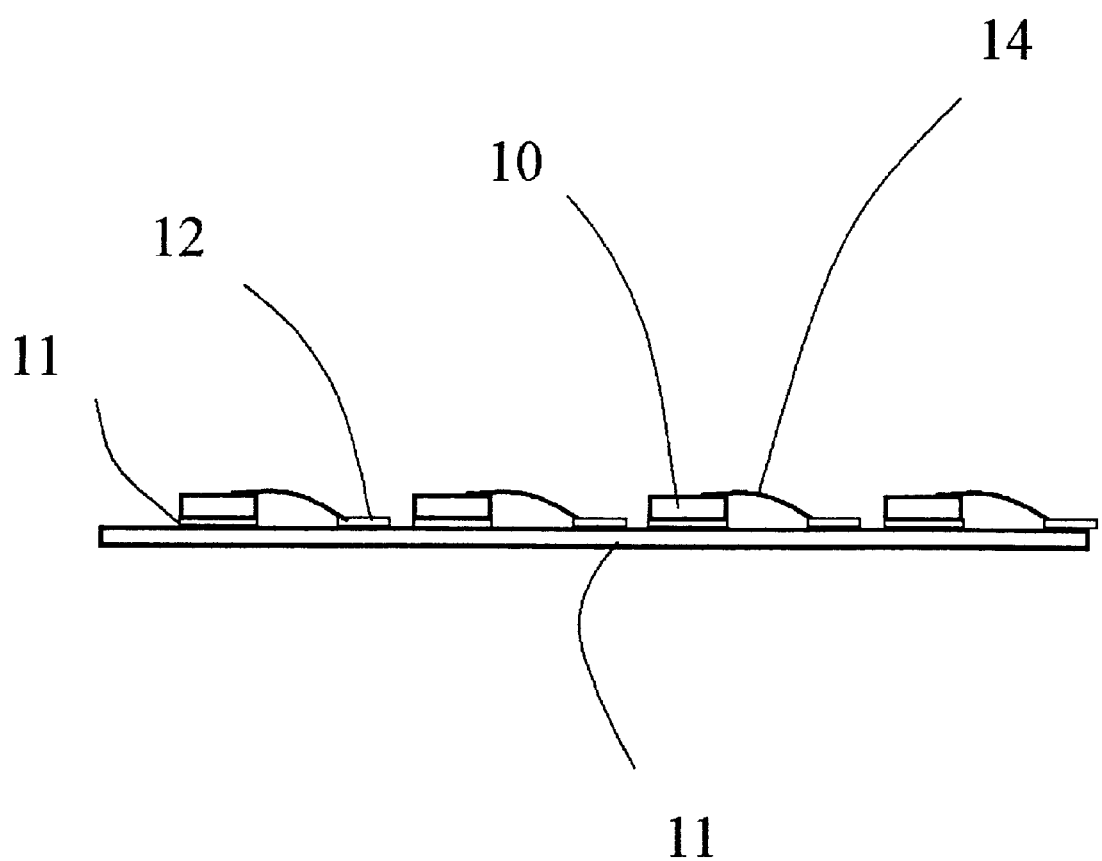
FIG. 2 shows the side view of FIG. 1.
Figure 3:
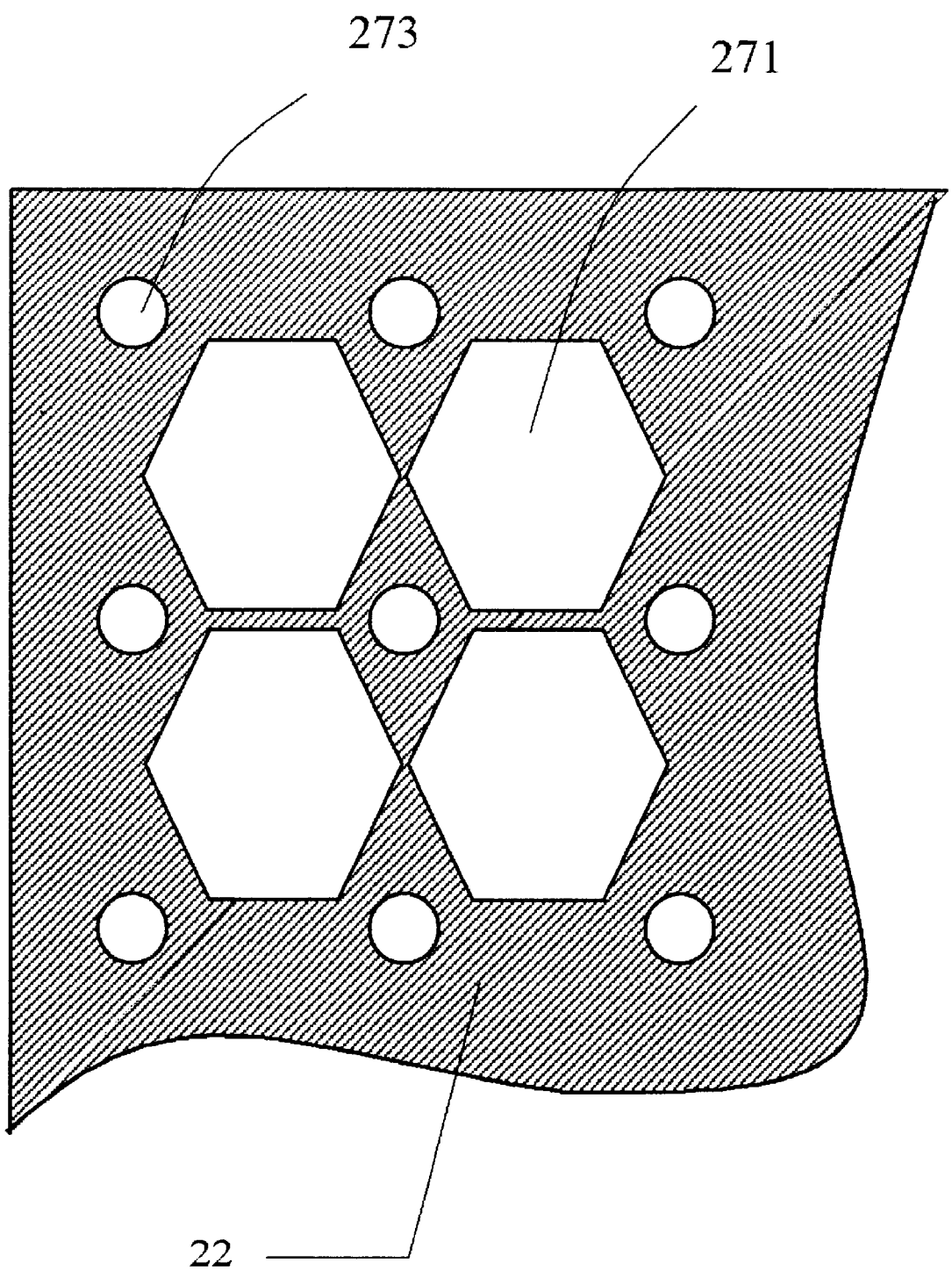
FIG. 3 shows the air ducts in the top metal frame of the present invention.
Figure 4:
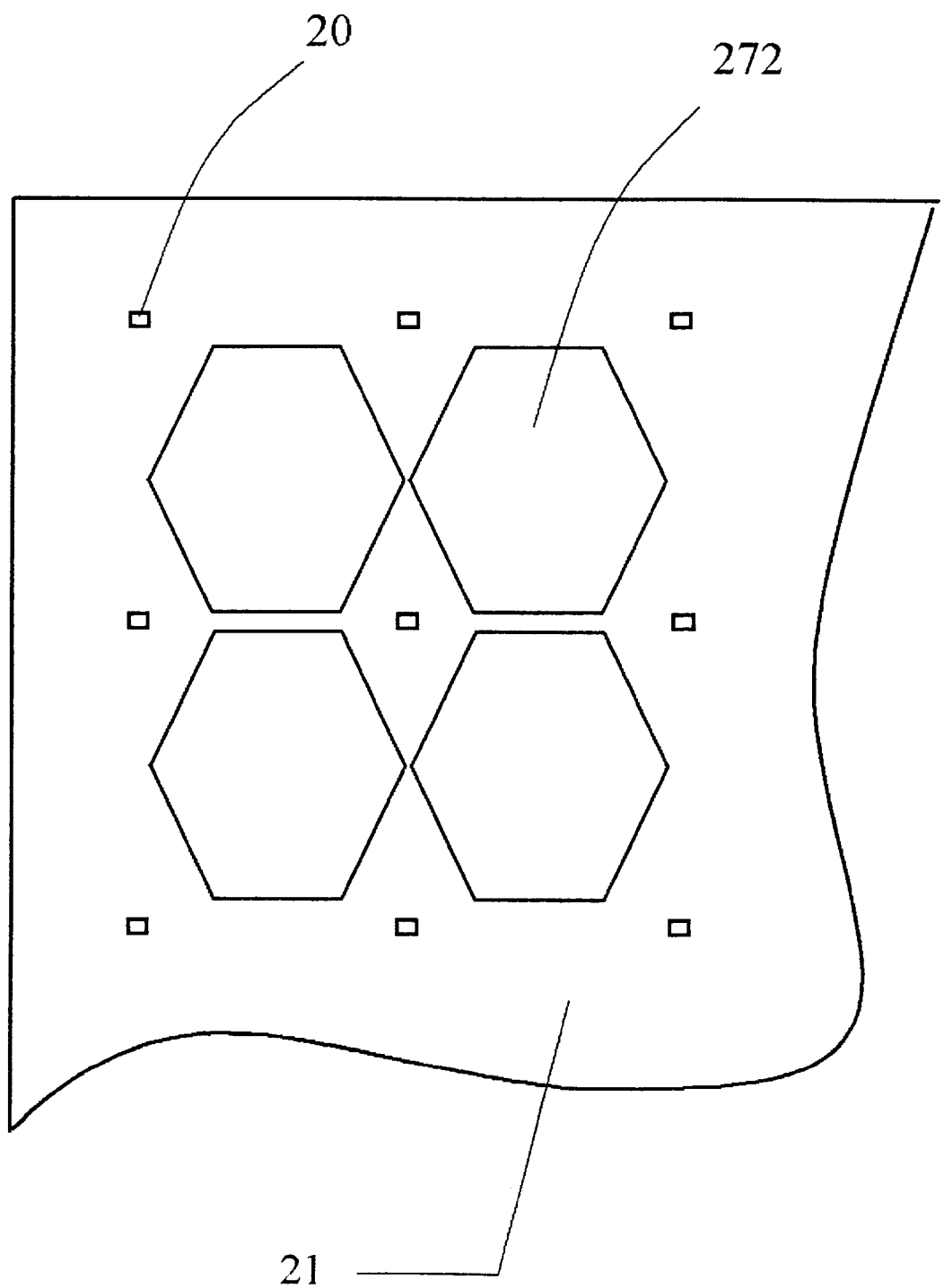
FIG. 4 shows the bottom metal frame, on which the LEDs are mounted.

The basic idea of the present invention to package an array of LED matrix is to use two metal frames interposed with an insulating substrate. The first metal frame 22 is shown in FIG. 3 with larger air ducts 271 and smaller air vents 273. The second metal frame 21, as shown in FIG. 4, is mounted with LEDs 20 and air ducts 272 which are aligned with the air ducts 271 of the fist metal frames 271 on top. Each LED is surrounded by the smaller air duct 271 of the first metal frame 22.

Figure 5:
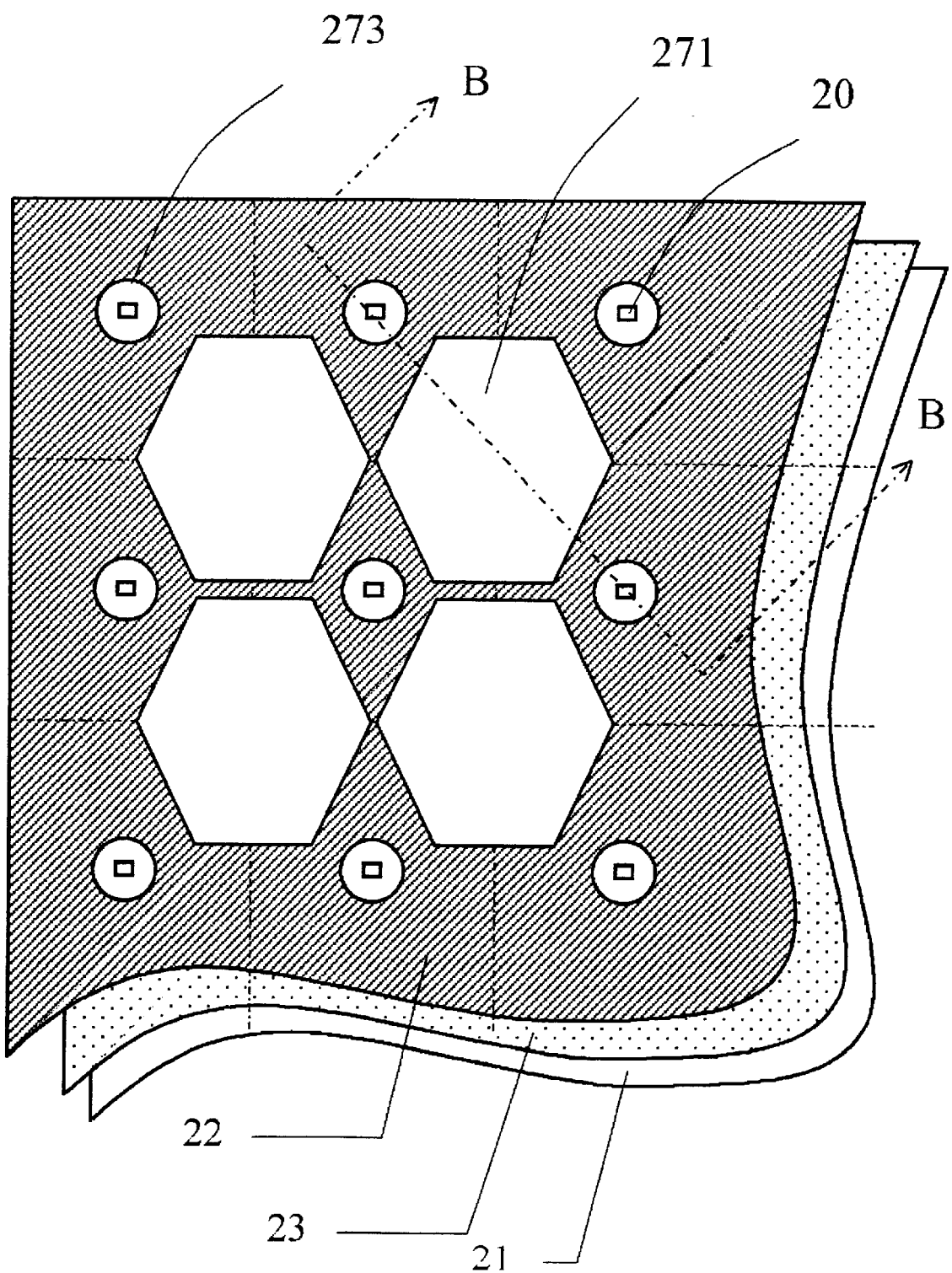
FIG. 5 shows the stacking of the metal frames over an insulating substrate.

FIG. 5 shows the stacking of the two metal plates 22 and 21 interposed with a spacer insulating layer 23. Note that each LED 20 of the matrix is surrounded by the smaller air duct 273. The larger air ducts 271 do not surround any LED, but allow air to flow. The smaller air duct forms 273 a cup to focus the light emitted from the LED.

Figure 6:
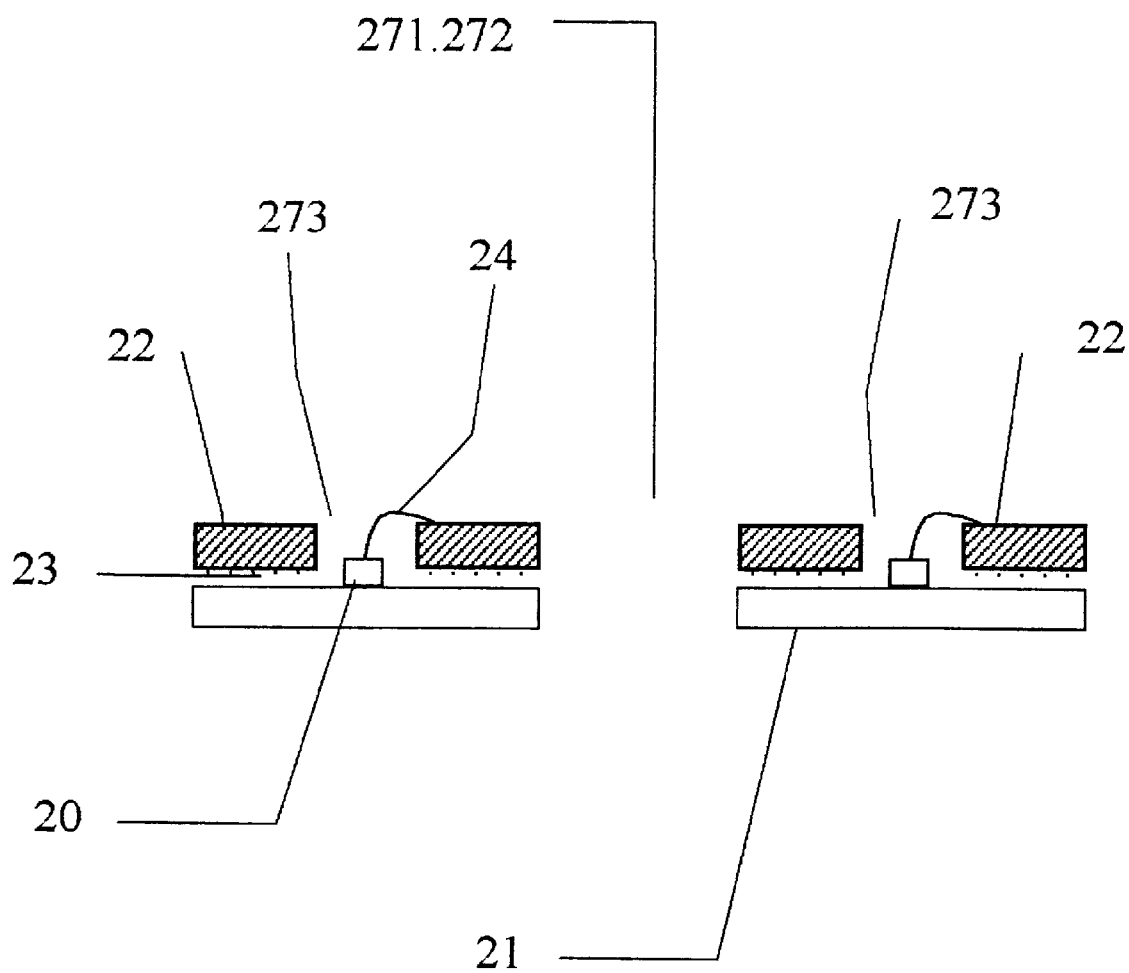
FIG. 6 shows a cross-section of metal frames surrounding a LED.

The cross-section view along the section line B-B' in FIG. 5 is shown in FIG. 6. The LED 20 is nested inside the air duct 273 and mounted on a second metal frame 21. The LED has a bottom electrode contacting the lower metal frame 21 and a top electrode wire-bonded to the upper metal frame 22 by wire 24. The larger air duct 271 of the fist metal frame 22 is aligned with the larger air duct 272 of the second metal frame 21. The first metal frame 22 and the second (lower) metal frame 21 is separated by means of spacers 23. Both the larger air ducts 271, 272 and the smaller air ducts 273 allow air to flow, thereby cooling down the LEDs 20.

Figure 7:
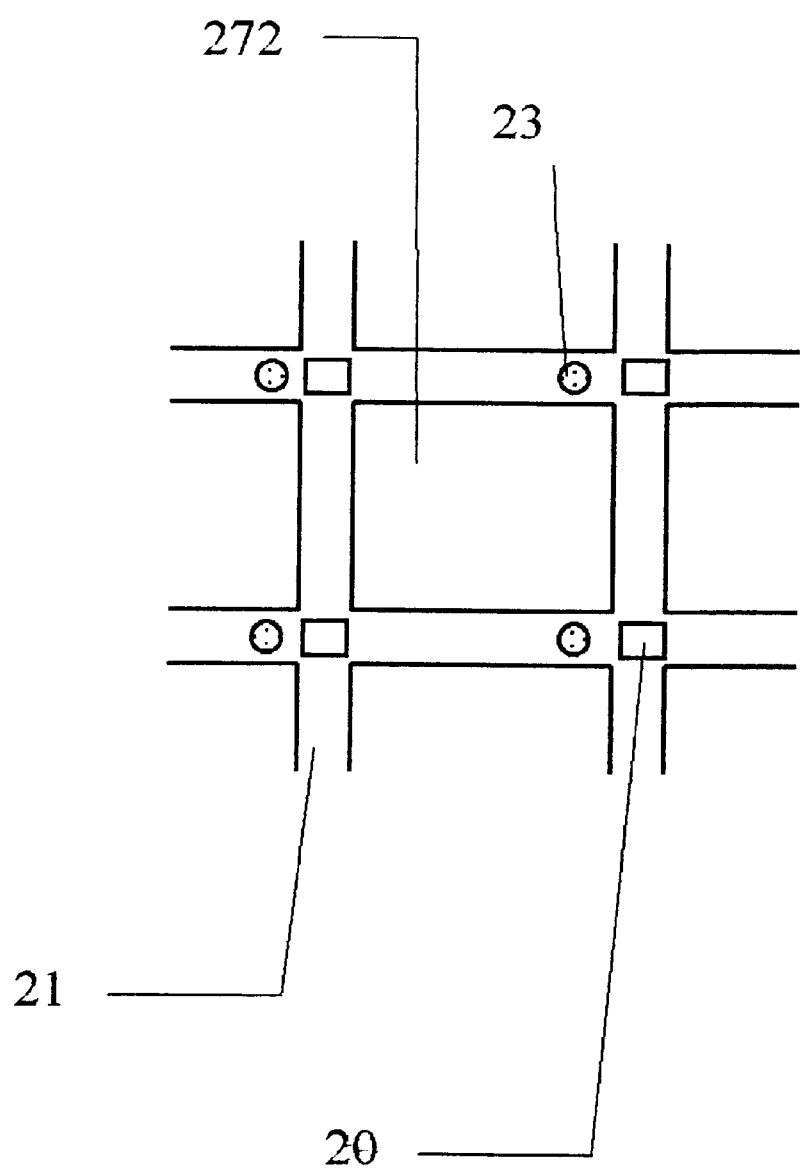
FIG. 7 shows spacers on the bottom metal frame of a second embodiment.
Figure 8:
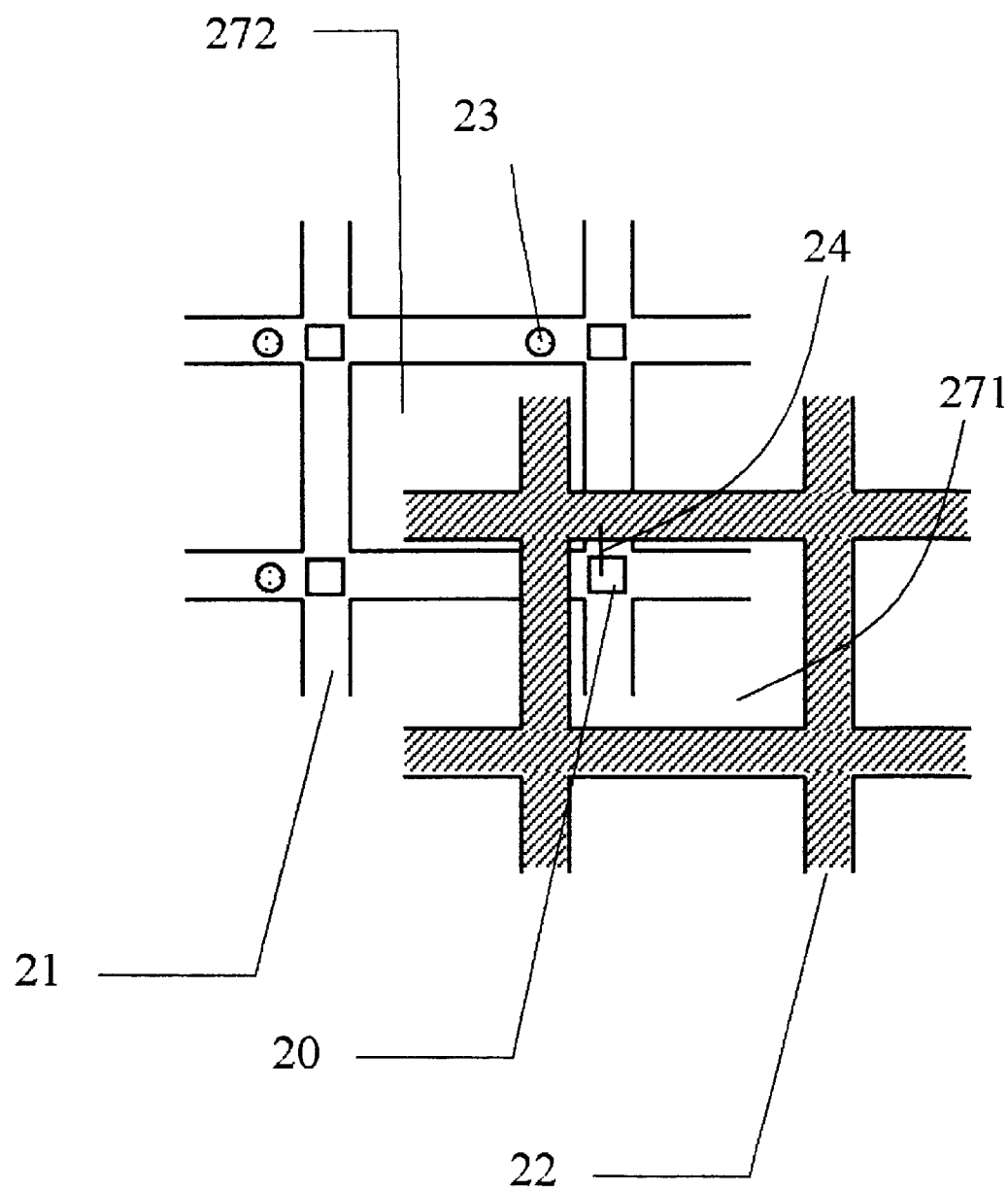
FIG. 8 shows wire-bonding of the top electrode of a LED to the common metal frame at a cross-point of a matrix of the second embodiment.

FIGS. 7 and 8 show the second embodiment of the present invention. FIG. 7 shows the top view of second metal frame 21, showing the spacers 23, LEDs 20 and the larger air ducts 272.

FIG. 8 shows a second metal frame 22 lying over the metal frame 21. In this structure, the first metal frame 22 has only large air ducts 271, which are offset from the large air ducts 272 of the second metal frame 21. The figure shows the top view of the first metal frame 22 stacking over the second metal frame 21, which mounts the spacers 23 and the LEDs 20 at the cross-points of the ribs of the lower metal frame 21. The air ducts 271 of the upper metal frames 22 and the air ducts 271 of the lower metal frames 21 are offset from each other to allow the top electrode of the LED 20 to be wire-bonded to the upper plate 22 by means of wire 24. The bottom electrode of the LED is in contact with the lower metal frame 21.

Figure 9:
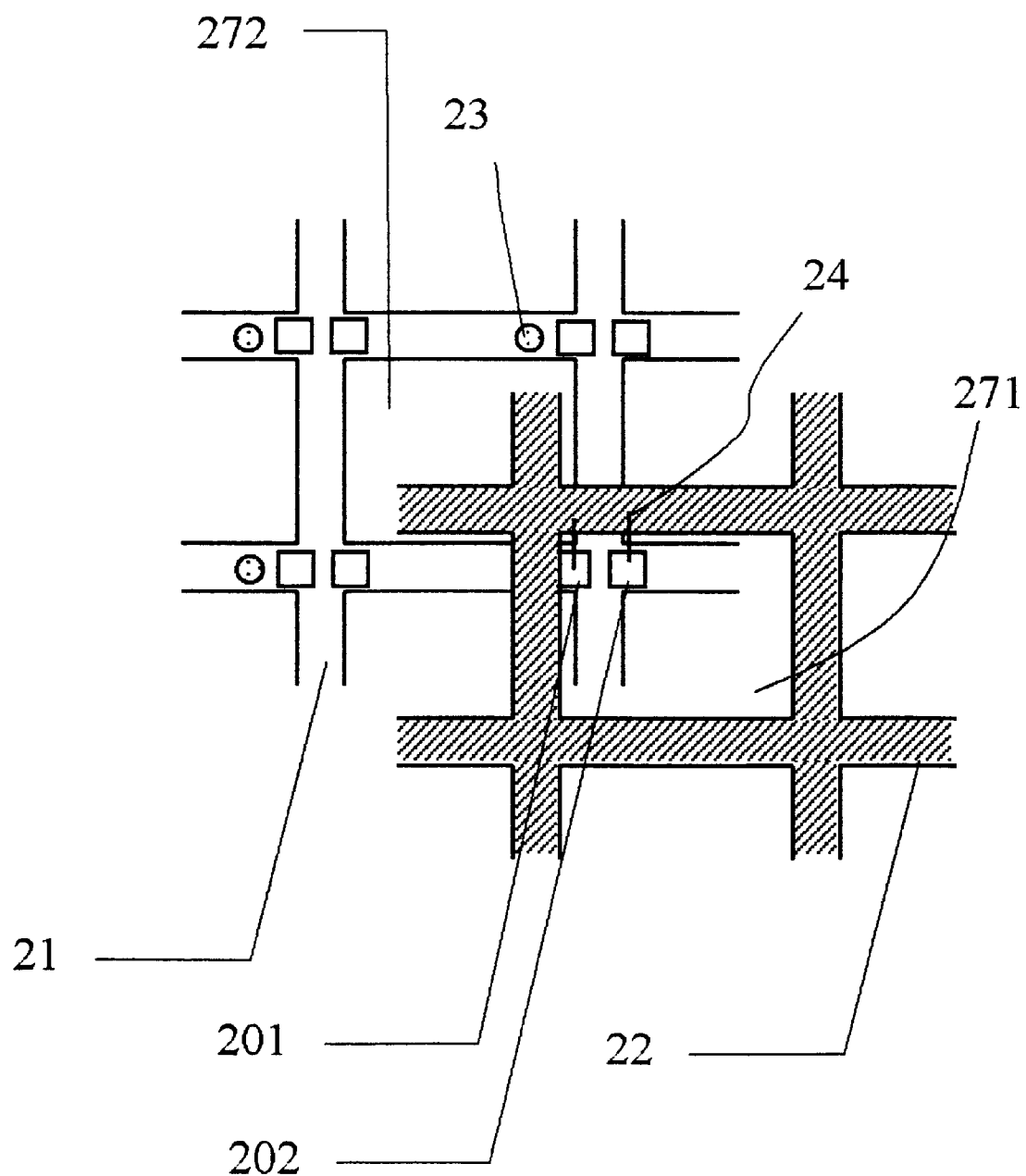
FIG. 9 shows wire-bonding of two LEDs at a cross-point of a matrix.

FIG. 9 shows a third embodiment of the present invention. Two LEDs 201 and 202 are placed at each the cross-point of the lower metal frame 21. The two top electrodes of the two LEDs are both wire-bonded to the upper metal frame 22 by means of wires 24.

Figure 10:
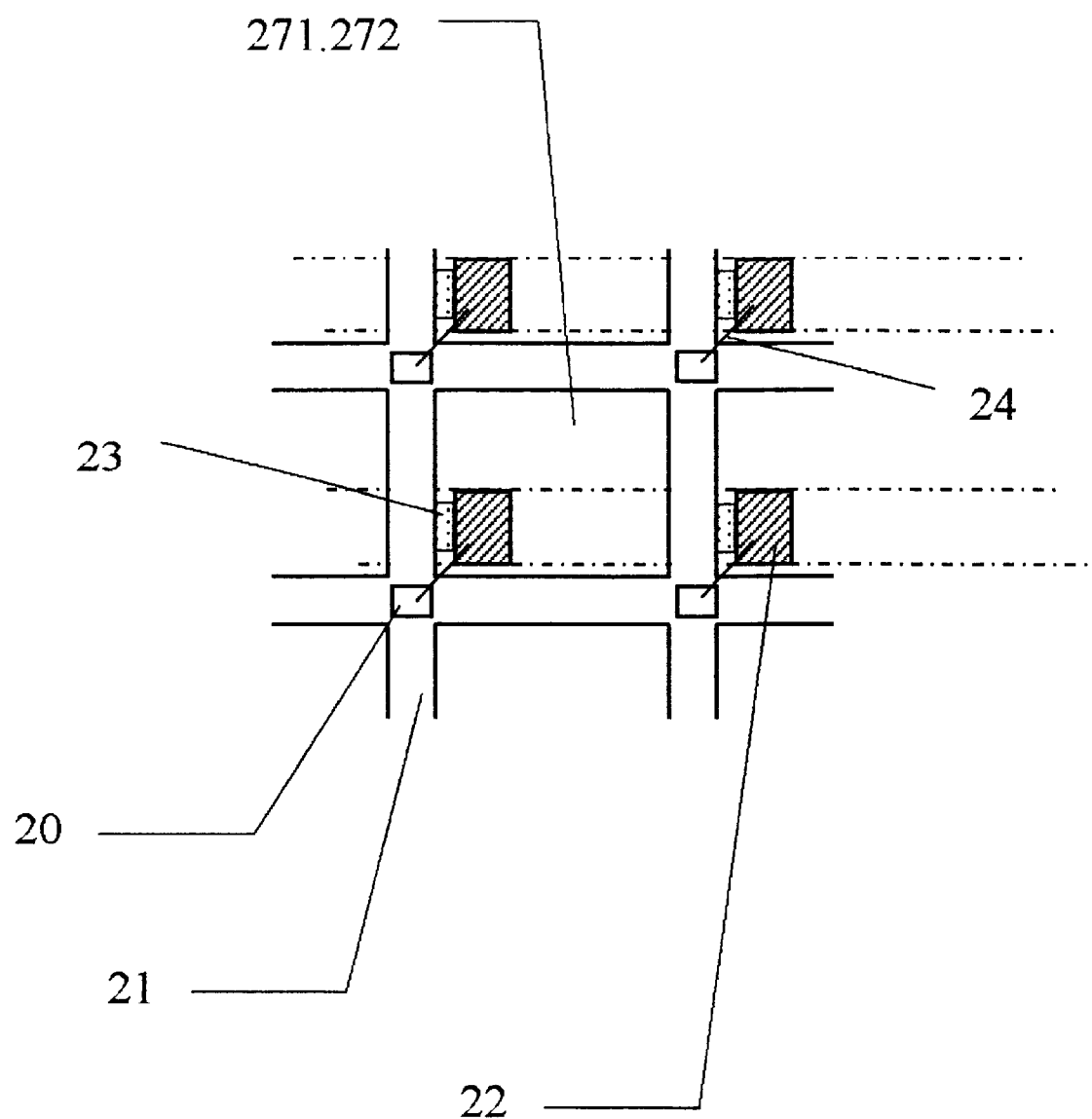
FIG. 10 shows pedestals on the bottom metal plate to be planar with the LED on the upper metal frame.

FIG. 10 shows a fourth embodiment of the present invention. Pedestals are erected on the fist metal frame 22 so that the top electrode of each LED 20 mounted on the second metal frame 21 is planar with the top surface of the pedestal for easy wire-bonding. Spacers 23 are placed between the second metal frame and the pedestal.

Figure 11:
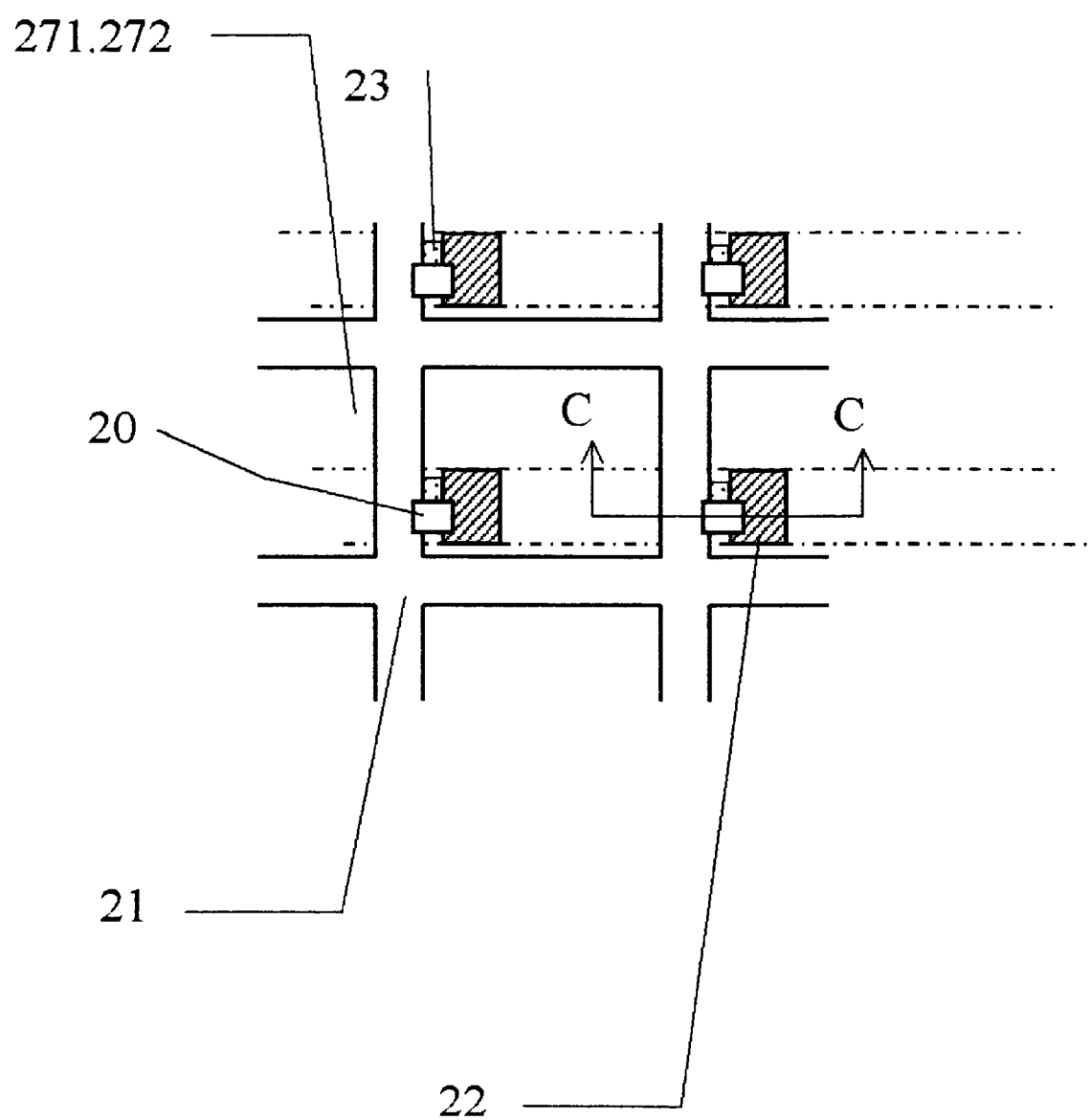
FIG. 11 shows the mounting of the LEDs with both bottom electrodes straddling over the structure in FIG. 10.
Figure 12:
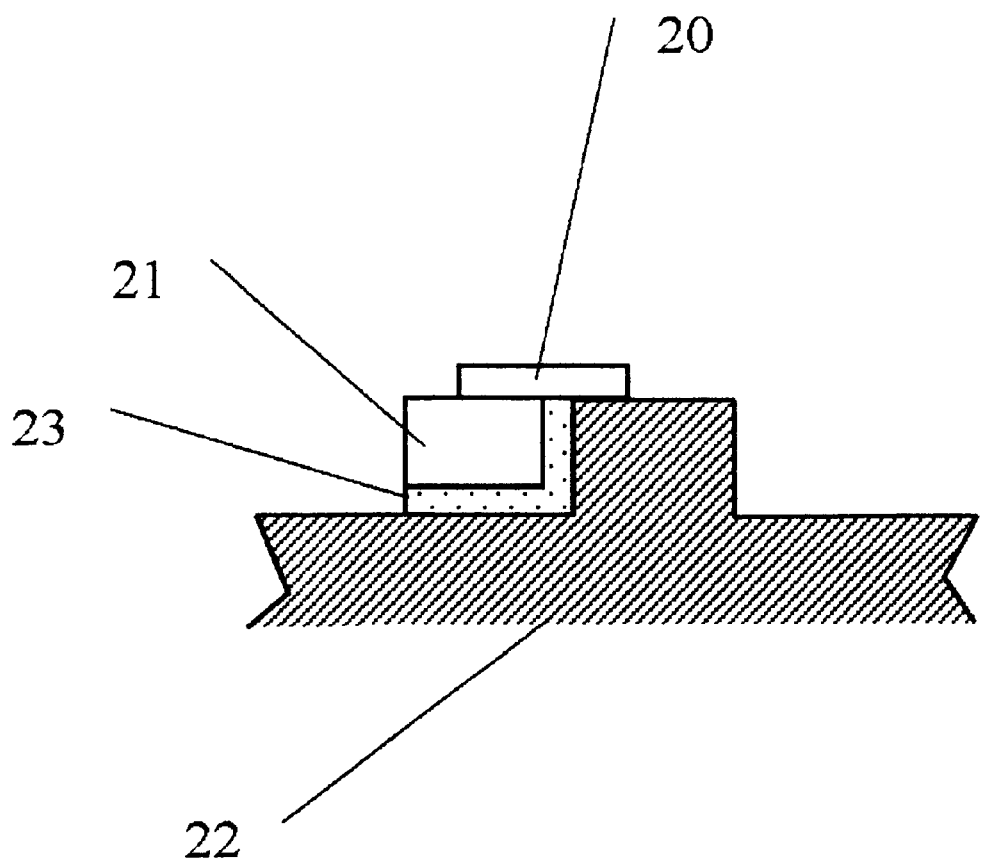
FIG. 12 shows the cross-section of a LED mounted on the structure in FIG. 11.

FIG. 11 shows a fifth embodiment of the present invention. As in FIG. 10, the lower metal frame 22 has pedestals to be planar the upper metal frame 21. Each LED has two bottom electrodes straddling between the pedestal and the metal frame 21. The section-view along the section line C-C' is shown in FIG. 12. Note that the top surface of the metal frame 21 and the top surface of the pedestal of the lower metal frame 22 are planar with each other, and are separated by insulator 23.

Figure 13:
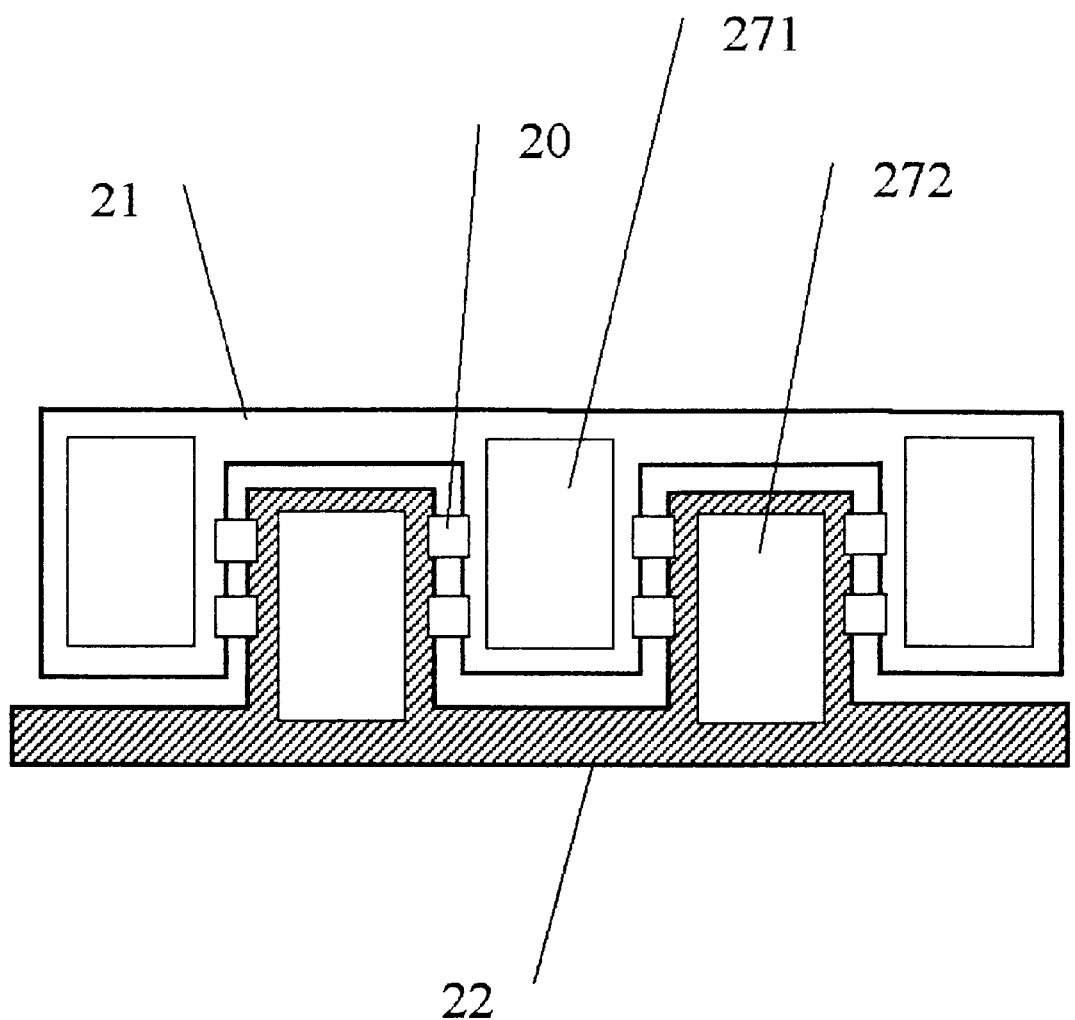
FIG. 13 shows the mounting of several LEDs straddling over two interdigital, horizontally placed, vented metal frames

FIG. 13 shows a sixth embodiment of the present invention. The first metal frame 22 and the second metal frame 21 lie on the same horizontal plane interdigitally. Air ducts 271 are placed in the first metal frame 22 and air ducts 272 are placed in the second metal frame 21 for air circulation. LEDs 20 each with two bottom electrodes straddle across the two metal frames.

Figure 14:
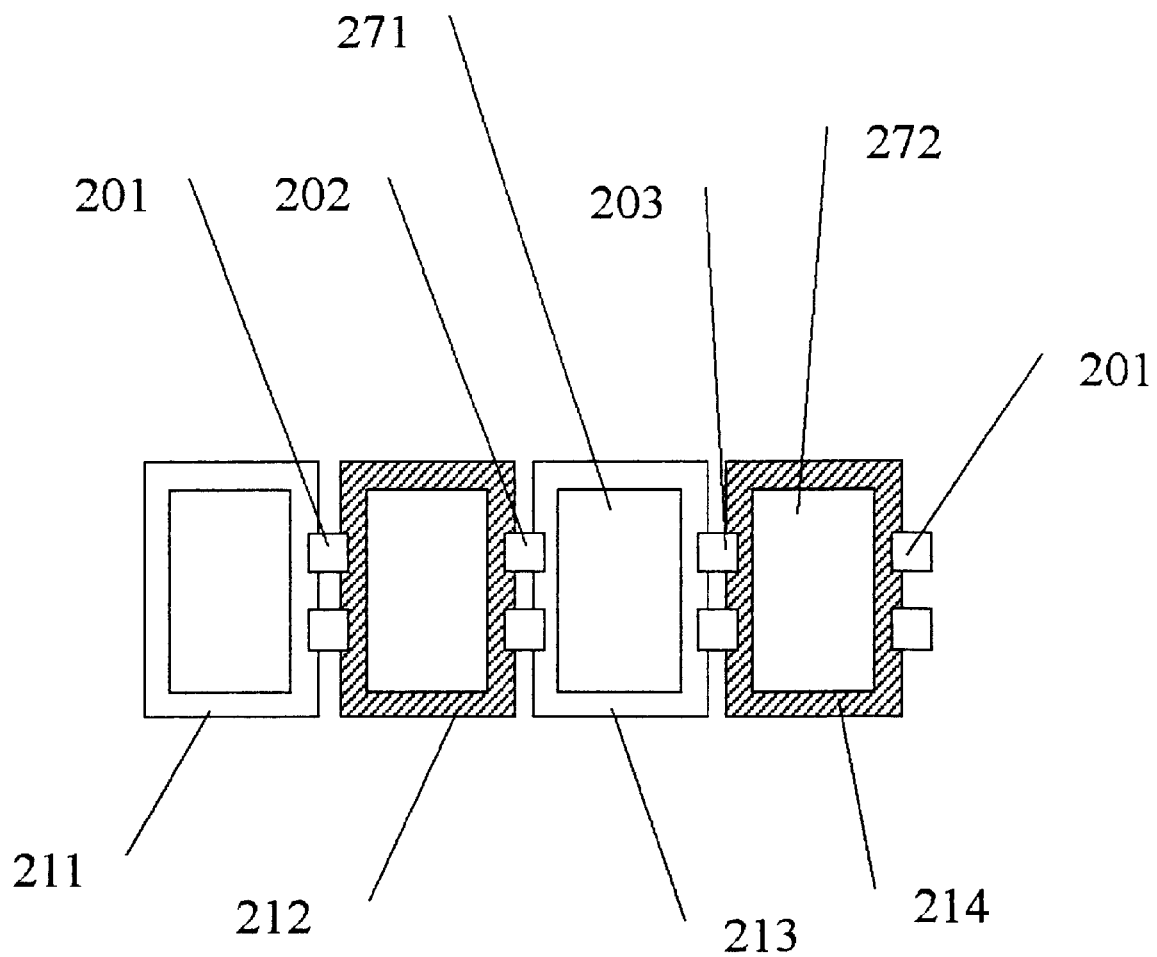
FIG. 14 shows another embodiment of mounting several LEDs with alternate metal frames for the common first electrodes of the LEDs and the common second electrodes of the LEDs.

FIG. 14 shows a seventh embodiment of the present invention. The first metal frames 212, 214 with air ducts 272 and the second metal frames 211, 213 with air ducts 271 are placed alternately. One or more LEDs 201, 202, 203, 204 each with two bottom electrodes straddle across two adjacent metal frames.

Figure 15:
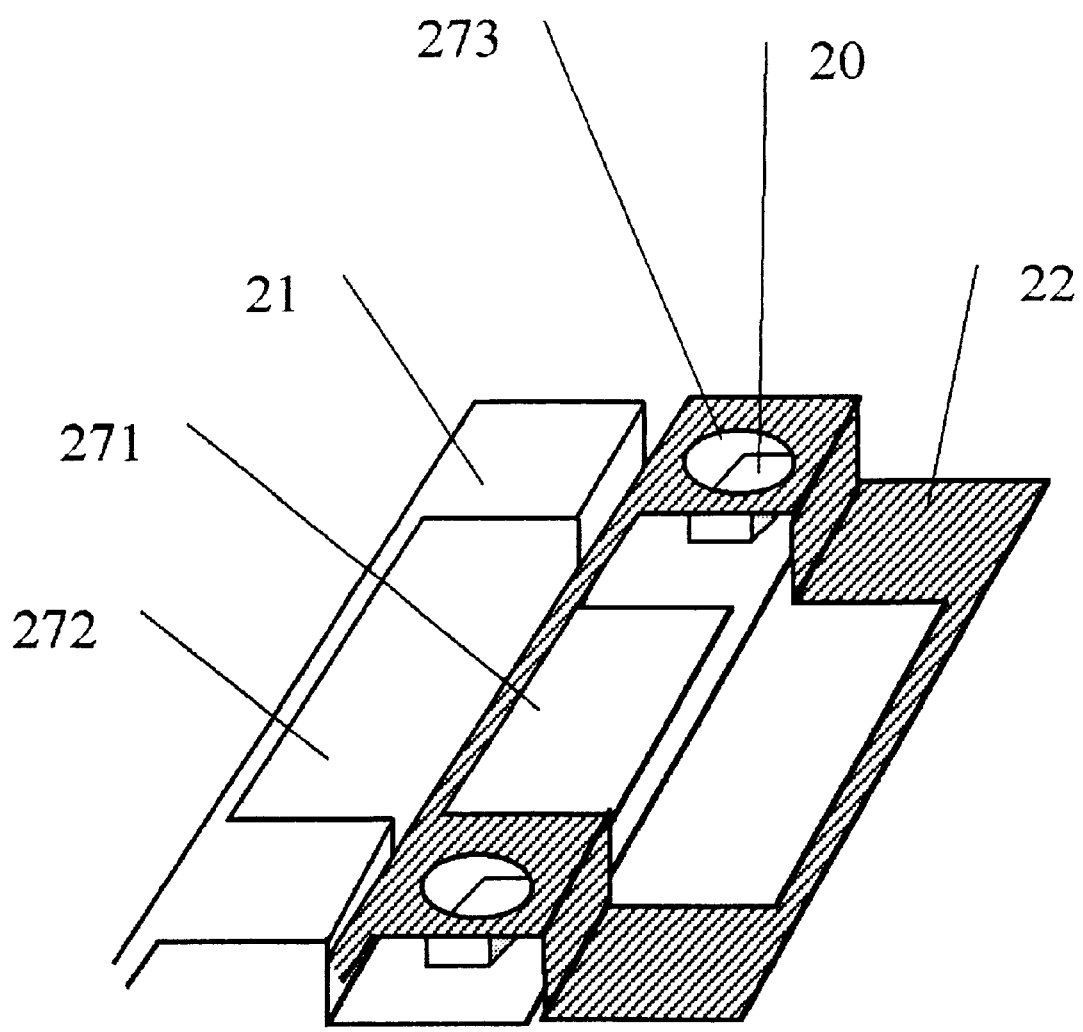
FIG. 15 shows Z-shape metal frames.

FIG. 15 shows an eighth embodiment of the present invention. The first metal frame 22 and the metal frame 21 are formed in Z-shape. The first metal frame 22 has a larger air duct 271 and a smaller air duct 273. The second metal frame 21 has an air duct 272 and is mounted with LEDs 20. The upper edge of the Z-shaped first metal frame 22 stacks over the lower edge of the Z-shaped second metal frame with each air duct 273 surrounding over a LED 20 and allowing light to be transmitted.

Figure 16:
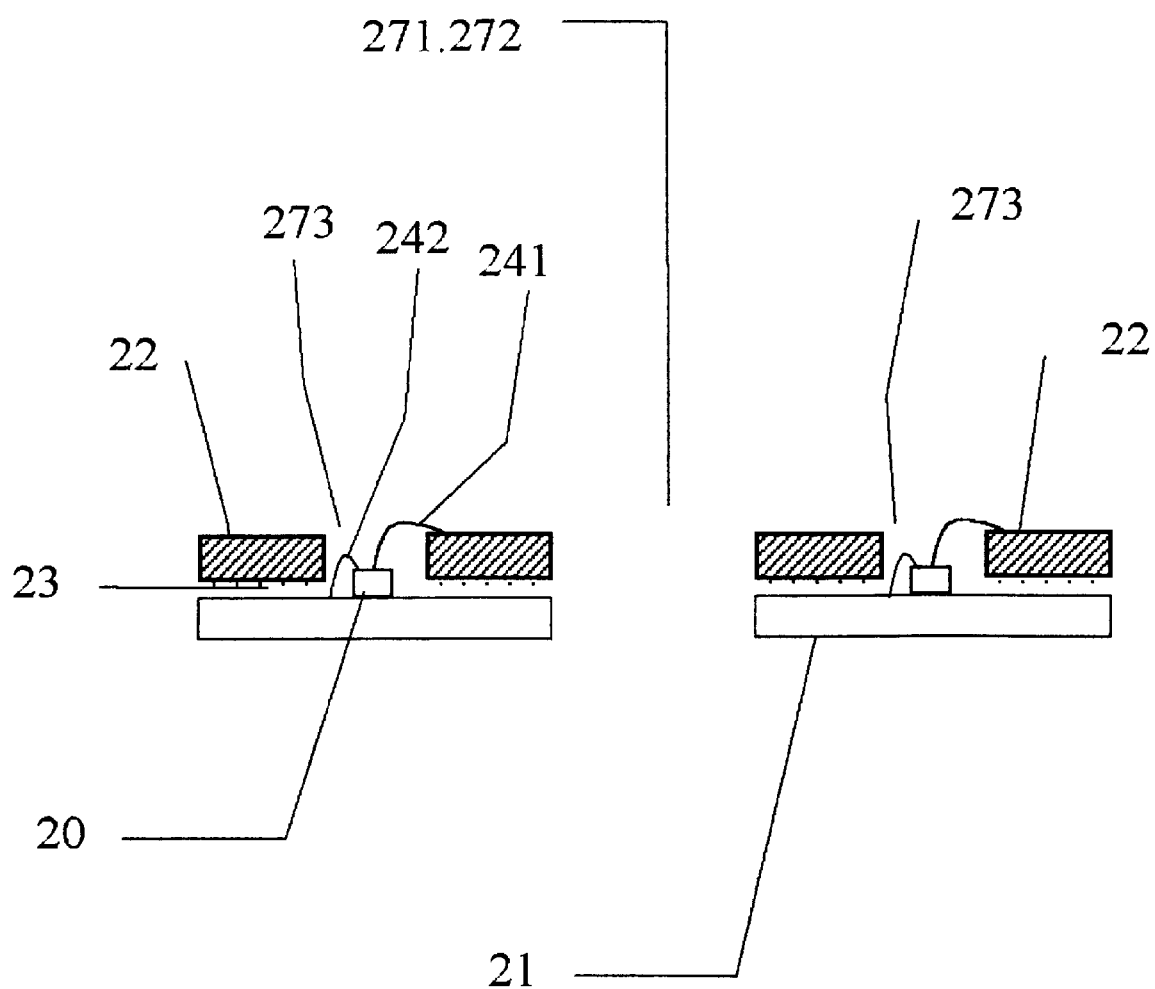
FIG. 16 shows wire-bonding of LEDs each with two top electrodes.

FIG. 16 shows a ninth embodiment of the present invention for the matrix shown in FIG. 5. When each LED 20 has both electrodes at the top surface, the two electrodes can be wire bonded by wires 241, 242 respectively to the first metal frame 22 and the second metal frames 21.

Figure 17:
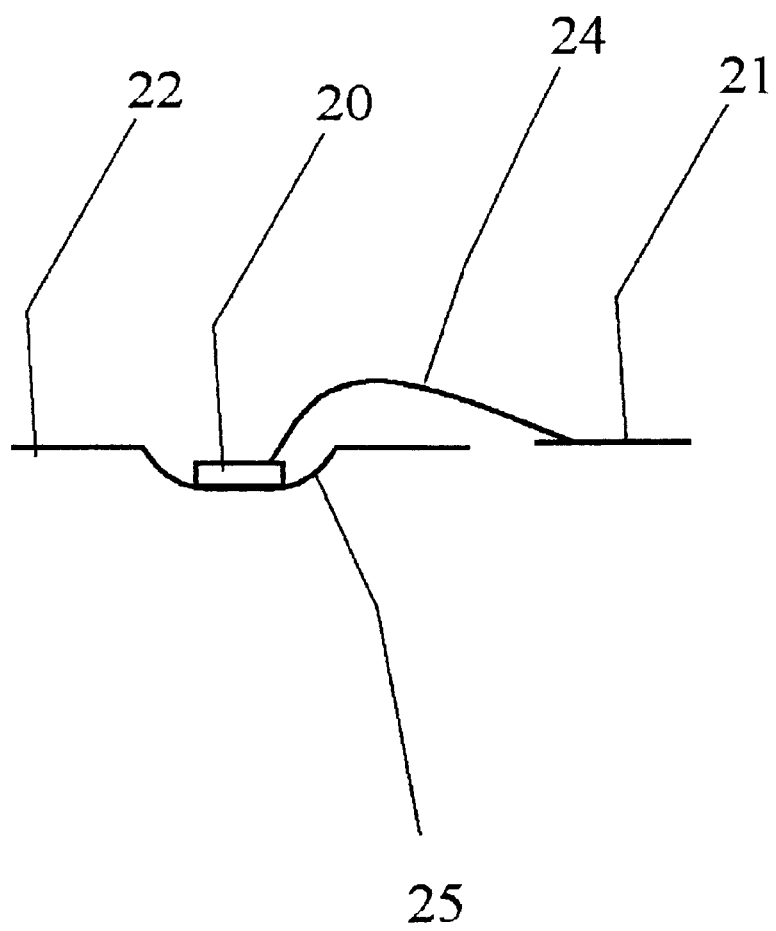
FIG. 17 shows focusing cups for each LED.

FIG. 17 shows the tenth embodiment of the present invention. The first metal frame 22 for mounting the LED 20 is recessed as a cup to focus the light emitted from the LED 20. The LED 20 shown in this figure has a bottom electrode contacting the first metal fame 22 and a top electrode wire-bonded by a wire 24 to the second metal frame 21.

Figure 18:
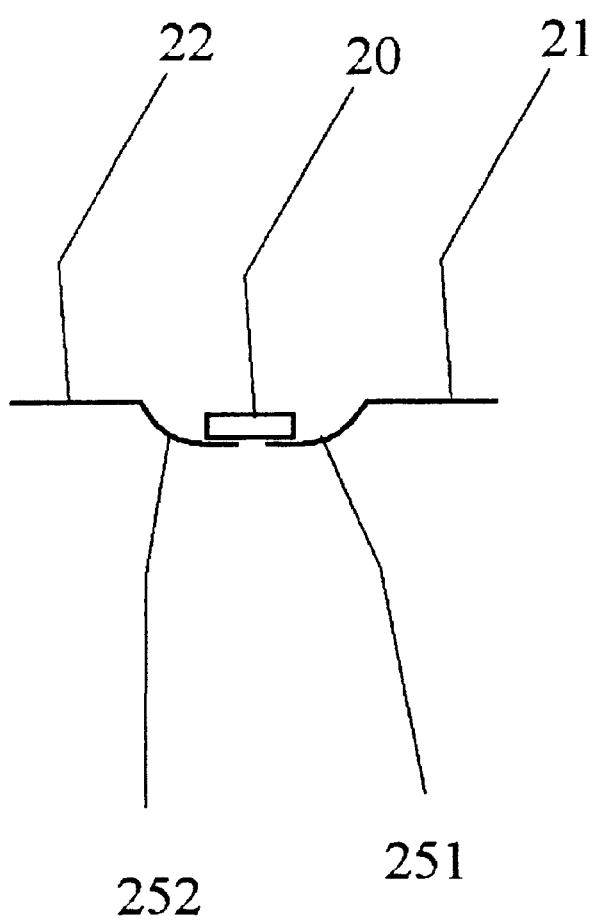
FIG. 18 shows focusing cup for LED with two bottom electrodes.

FIG. 18 shows an eleventh embodiment of the present invention. The LED 20 has two bottom electrodes straddling across the first metal frame 22 and the second metal frame 21. The edges 252, 251 of the two metal frames are bent in the shape of a cup to focus the light emitted from the LED 20.

While the preferred embodiments of the invention has been described, it will be apparent to those skilled in the art that various modifications may be made in the embodiments without departing from the spirit of the present invention. Such embodiments are all within the scope of this invention.

What is claimed is:

1. A light emitting diode (LED) matrix display panel, comprising:

an array of LEDs each having a first electrode and a second electrode;

a first metal frame normal to the emitted light from said LEDs for bonding the first electrode of said LED to conduct current and for radiating heat generated in said LEDs, having a plurality of first large air ducts, a second metal frame for mounting said LEDs and bonding the second electrode of said LED to conduct current and for radiating heat generated in said LEDs, having a plurality of second air ducts each corresponding to said first large air ducts;

spacers to insulate electrically said first metal frame and said second metal frame, and circulating air in said first larger air ducts and second air duct to propagate air radially along the surfaces of said first metal frame and said second metal frame for air-cooling the LEDs.

2. The LED matrix display panel as described in claim 1, further comprising a plurality of secondary air ducts in said second metal frame, smaller than said first large air ducts and each surrounding one said LED mounted on said first metal frame.

3. The LED matrix display panel as described in claim 1, wherein said spacers in the form of an insulating layer are sandwiched between said first metal frame and said second metal frame.

4. The LED matrix display panel as described in claim 1, wherein each one of said LEDs has the first electrode at the bottom of said LED bonded to said second metal frame, and second electrode at the top of said LED wire bonded to said first metal frame.

5. The LED matrix display panel as described in claim 1, wherein each one of said LED has said first electrode and said second electrode both on top surface of said LED and wire-bonded respectively to said metal frame and said second metal frame.

6. The LED matrix display panel as described in claim 1, wherein said first metal frame is offset from said second metal frame such that each said LED mounted on said second metal frame protrudes from the large air duct of said first metal frame.

7. The LED matrix display panel as described in claim 1, wherein said first metal frame is offset from said second metal frame such that two said LEDs mounted on said second metal frame protrude from each one of the large air ducts of the first metal frame.

8. The LED matrix display panel as described in claim 1, wherein said first metal frame is placed underneath said second metal frame and contain a plurality of pedestals rising up to the same elevation as the LED and each bonding to one of said LED.

9. The LED matrix display panel as described in claim 8, wherein each one of said LEDs has two bottom electrodes straddling between one of said pedestals and said second metal frame.

10. The LED matrix display panel as described in claim 9, wherein each one of said pedestals is butted against said metal frame through a spacer.

11. The LED matrix display panel as described in claim 1, wherein first metal frame lies on the same horizontal plane as said second metal frame interdigitally, and each one of said LEDs straddles across said first metal frame and said second metal frame.

12. The LED matrix display panel as described in claim 1, further comprising a plurality of first metal frame and a plurality of a plurality of second metal frame lying on same horizontal plane and placed alternately adjacent to each other and having said LEDs straddling between said first metal frame and said second metal frame.

13. The LED matrix display panel as described in claim 2, wherein said first metal frame and said second metal frame are of Z-shape with each smaller air duct of the upper edge of said first metal frame overlaying the LED mounted on the lower edge of the second metal frame.

14. The LED matrix display panel as described in claim 1, wherein the surface of the second metal frame for mounting the LED is recessed as a cup for focusing the light emitting from the LED.

15. The LED matrix display panel as described in claim 11, wherein the first metal frame and the second metal frame where the LED is mounted are recessed as a cup to focus the light emitted from the LED.

* * * * *